United States Patent
Hsieh

(10) Patent No.: US 11,910,565 B2
(45) Date of Patent: Feb. 20, 2024

(54) COOLING LIQUID FLOW CONTROL DEVICE

(71) Applicants: Inventec (Pudong) Technology Corporation, Shanghai (CN); INVENTEC CORPORATION, Taipei (TW)

(72) Inventor: Han Chih Hsieh, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 154 days.

(21) Appl. No.: 17/457,442

(22) Filed: Dec. 3, 2021

(65) Prior Publication Data
US 2023/0156957 A1    May 18, 2023

(30) Foreign Application Priority Data
Nov. 12, 2021   (CN) .......................... 202111337334.4

(51) Int. Cl.
*H05K 7/20* (2006.01)

(52) U.S. Cl.
CPC ..... *H05K 7/20272* (2013.01); *H05K 7/20281* (2013.01)

(58) Field of Classification Search
CPC .......... H05K 7/20772; H05K 7/20272; H05K 7/20281; H05K 7/20254; H05K 7/20263
See application file for complete search history.

(56) References Cited

U.S. PATENT DOCUMENTS

2016/0183409 A1* 6/2016 Zhou ................... H01L 23/4735
                                                                    165/104.31
2021/0378139 A1* 12/2021 Rice .................... H01L 23/4735

* cited by examiner

*Primary Examiner* — Frantz F Jules
*Assistant Examiner* — Martha Tadesse
(74) *Attorney, Agent, or Firm* — CKC & Partners Co., LLC

(57) ABSTRACT

A cooling liquid flow control device includes a heat dissipation bottom plate, a fixing holder, a cooling module, and a temperature control element. The heat dissipation bottom plate has a bottom surface configured to be in contact with a heating element on a substrate. The fixing holder is connected to the heat dissipation bottom plate and configured to be fixed with the substrate. The cooling module is connected to a top surface of the heat dissipation bottom plate to form a cavity. The cavity is configured to circulate a cooling liquid. The temperature control element is connected to the cooling module and includes a valve. The valve is configured to rotate based on a temperature of the heating element, thereby adjusting a flow rate of the cooling liquid in and out of the cavity.

9 Claims, 7 Drawing Sheets

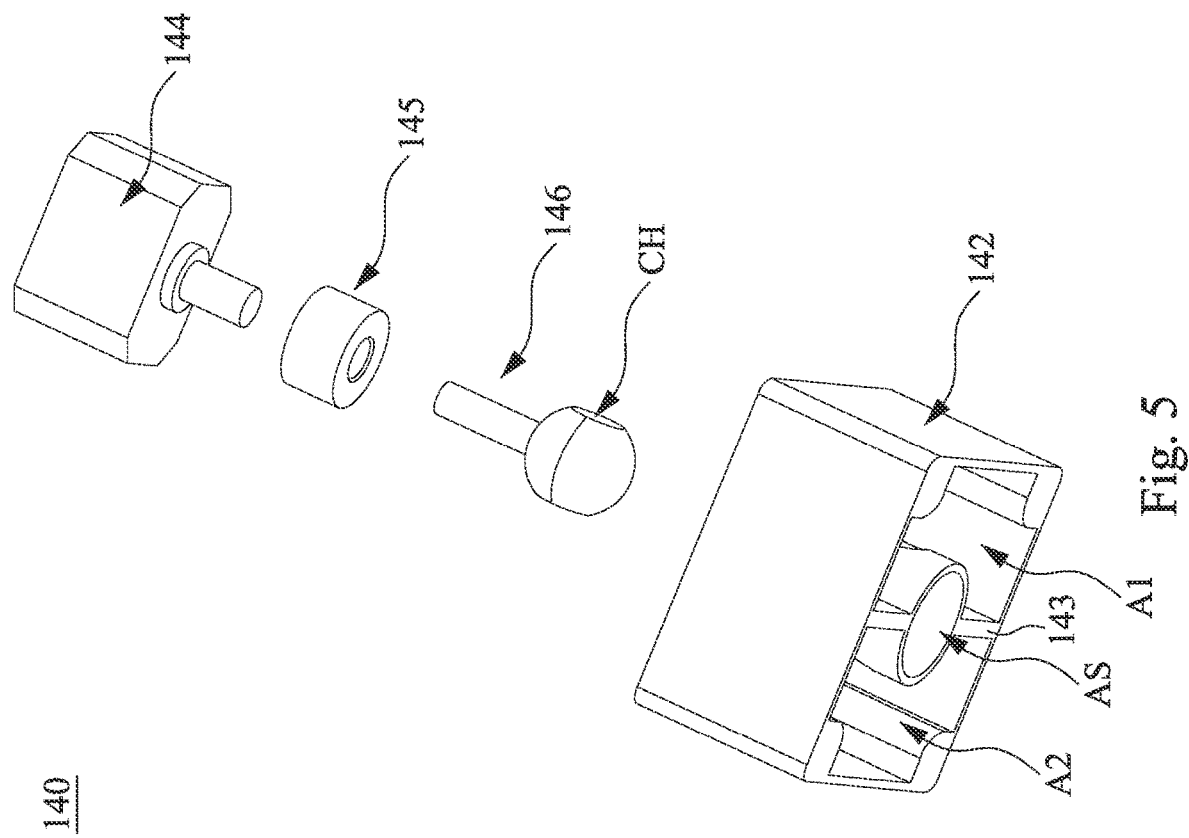

COOLING LIQUID FLOW CONTROL DEVICE

CROSS-REFERENCE TO RELATED APPLICATION

This application claims priority to China Application Serial Number 202111337334.4, filed Nov. 12, 2021, which is herein incorporated by reference in its entirety.

BACKGROUND

Field of Invention

The present disclosure relates to a cooling liquid flow control device.

Description of Related Art

The water-cooling module of the conventional electronic components (for example, CPU) uses a thermally conductive substrate as the substrate, cooperating with the water inlet side and the water outlet side as the internal circulation loop for heat exchange to achieve the effect of heat dissipation of the electronic component, and utilizes the hole position corresponding to the electronic component platform to perform the fixation on the printed circuit board (PCB).

However, the conventional water-cooling module does not have the function of controlling the flow rate (for example, the flow rate of the cooling water). Since the water-cooling module cannot control the flow rate, the water-cooling module cannot optimize the heat dissipation of the electronic components in the idle or full load state, and thus cannot adjust the electrical load of the cooling distribution unit (CDU) to the system.

Therefore, how to propose a cooling liquid flow control device that can solve the aforementioned problems is one of the problems that the industry urgently wants to invest in research and development resources to solve.

SUMMARY

In view of this, one purpose of present disclosure is to provide a cooling liquid flow control device that can solve the aforementioned problems.

In order to achieve the above objective, according to one embodiment of the present disclosure, a cooling liquid flow control device includes a heat dissipation bottom plate, a fixing holder, a cooling module and a temperature control element. The heat dissipation bottom plate has a bottom surface configured to be in contact with the heating element on a substrate. The fixing holder is connected to the heat dissipation bottom plate and configured to be fixed with the substrate. The cooling module is connected to a top surface of the heat dissipation bottom plate to form a cavity. The cavity is configured to circulate a cooling liquid. The temperature control element is connected to the cooling module and includes a valve. The valve is configured to rotate based on a temperature of the heating element, thereby adjusting a flow rate of the cooling liquid in and out of the cavity.

In one or more embodiments of the present disclosure, the cooling liquid flow control device further includes a liquid inlet pipe and a liquid outlet pipe. The cavity further includes a first sub-cavity and a second sub-cavity. The first sub-cavity is configured to receive the cooling liquid from the liquid inlet pipe. The second sub-cavity is configured to deliver the cooling liquid from the first sub-cavity to the liquid outlet pipe.

In one or more embodiments of the present disclosure, the cooling module further includes a top plate, a side wall, and a separating wall. The top plate has a liquid inlet hole and a liquid outlet hole. The liquid inlet hole is connected between the first sub-cavity and the temperature control element. The liquid outlet hole is connected between the temperature control element and the second sub-cavity. The side wall extends vertically from an edge of the top plate and surrounds the edge of the top plate. The side wall is connected to the heat dissipation bottom plate. The separating wall extends vertically from the top plate and separates the first sub-cavity and the second sub-cavity. The separating wall is connected to the heat dissipation bottom plate.

In one or more embodiments of the present disclosure, the temperature control element further includes a chamber body and an actuator. The chamber body is configured to accommodate the cooling liquid from the first sub-cavity. The actuator is close to the chamber body and is configured to actuate the valve.

In one or more embodiments of the present disclosure, the cooling liquid flow control device further includes a processing unit. The processing unit is configured to receive a signal of the temperature of the heating element. The processing unit is further configured to convert the signal to a current output to the actuator, in which the current causes the valve to rotate.

In one or more embodiments of the present disclosure, the chamber body includes a liquid inlet area, a liquid outlet area, and a spacing portion. The liquid inlet area is configured to receive the cooling liquid from the first sub-cavity. The liquid outlet area is configured to deliver the cooling liquid from the liquid inlet area to the second sub-cavity. The spacing portion is configured to separate the liquid inlet area and the liquid outlet area.

In one or more embodiments of the present disclosure, the spacing portion has an opening connected between the valve and one of the liquid inlet area and the liquid outlet area.

In one or more embodiments of the present disclosure, the valve has a through hole, and when the through hole is aligned with the opening, the through hole and the opening jointly form at least a part of a channel.

In one or more embodiments of the present disclosure, the spacing portion further has another opening and an accommodating space for accommodating the valve, the opening is connected between the liquid inlet area and the accommodating space, and the another opening is connected between the liquid outlet area and the accommodating space, in which when two ends of the through hole are aligned with the opening and the another opening respectively, the through hole, the opening, and the another opening jointly form the channel.

In one or more embodiments of the present disclosure, the valve is configured to rotate to cause the through hole not to be aligned with the opening so as not to communicate the liquid inlet area and the liquid outlet area when the heating element is in an idle state. The valve is further configured to rotate to cause the through hole to be aligned with the opening so as to communicate the liquid inlet area and the liquid outlet area when the heating element is in a normal operating state.

In summary, In the cooling liquid flow control device of the present disclosure, since the temperature control element utilizes the feature that the valve can rotate based on the temperature of the heating element, the through holes of the valve can be aligned or not aligned with the openings to achieve the purpose of controlling the flow rate of the cooling liquid. In the cooling liquid flow control device of the present disclosure, the valve can proportionally communicate the liquid inlet area and the liquid outlet area based on the temperature of the heating element, thereby achieving the energy saving effect of the cooling liquid flow control device.

The above-mentioned description is only used to explain the problem to be solved by the present disclosure, the technical means to solve the problem, and the effects produced, etc. The specific details of the present disclosure will be well discussed in the following embodiments and related drawings.

BRIEF DESCRIPTION OF THE DRAWINGS

In order to make the above and other objectives, features, advantages and examples of the present disclosure more obvious, the description of the accompanying drawings is as follows:

FIG. 5 shows an exploded view of a temperature control device, in accordance with an embodiment of present disclosure;

DETAILED DESCRIPTION

Figure 1:
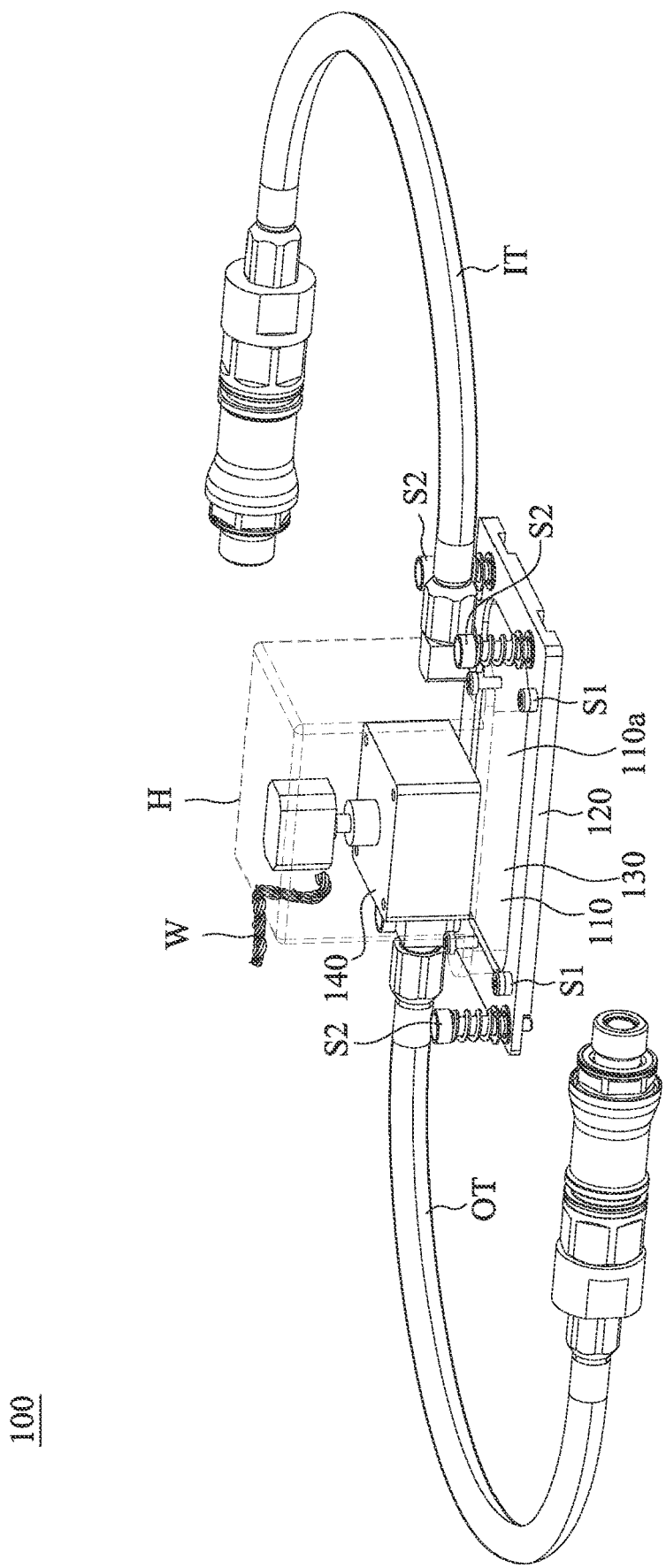
FIG. 1 shows a schematic view of a cooling liquid flow control device, in accordance with an embodiment of present disclosure.

Hereinafter, a plurality of embodiments of the present disclosure will be disclosed in diagrams. For clarity of discussion, many details in practice will be described in the following description. However, it should be understood that these details in practice should not limit present disclosure. In other words, in some embodiments of present disclosure, these details in practice are unnecessary. In addition, for simplicity of the drawings, some conventionally used structures and elements will be shown in a simple schematic manner in the drawings. The same reference numbers are used in the drawings and the description to refer to the same or like parts.

Hereinafter, the structure and function of each component included in a cooling liquid flow control device 100 of this embodiment and the connection relationship between the components will be described in detail.

Figure 2:
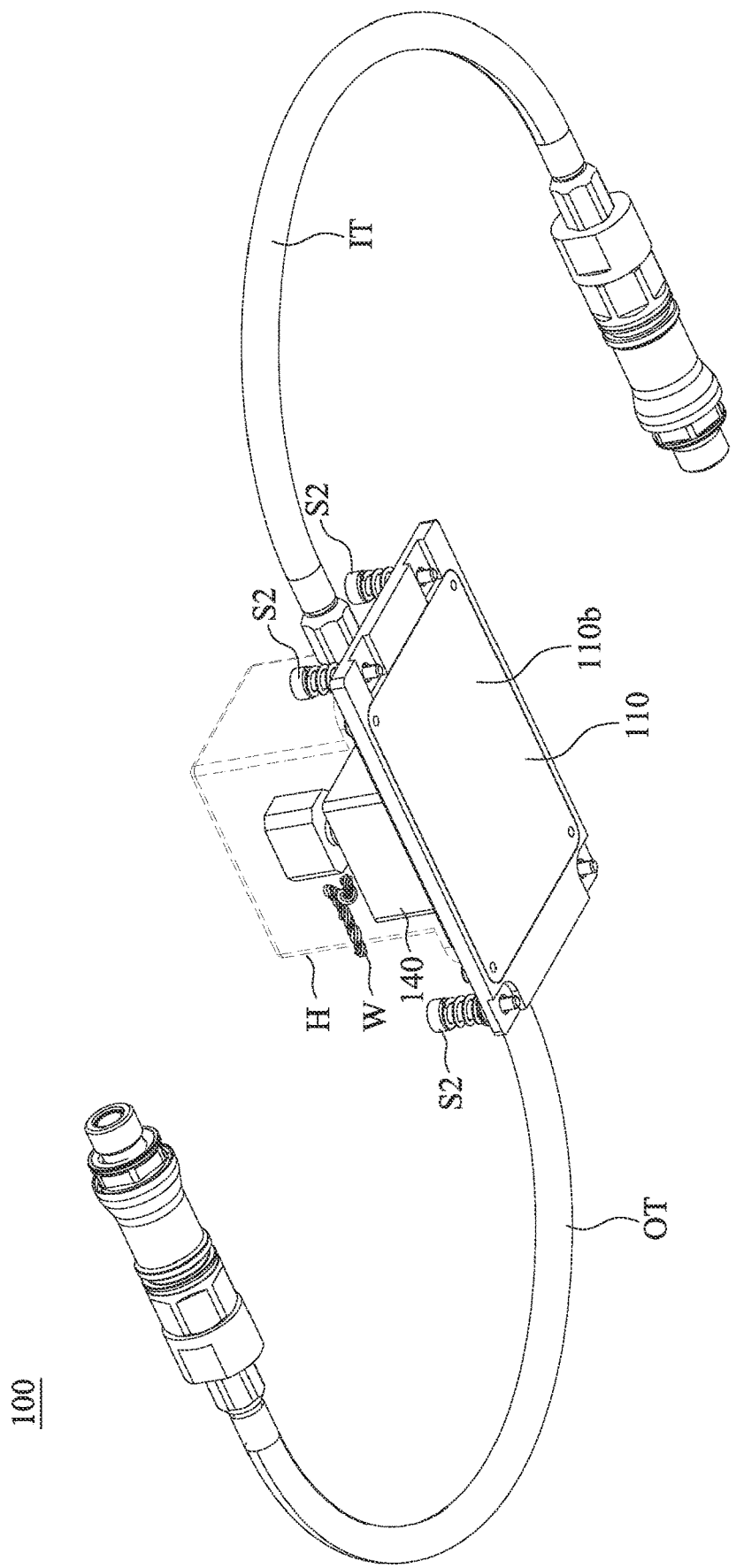
FIG. 2 shows another schematic view of a cooling liquid flow control device, in accordance with an embodiment of present disclosure.

Reference is made to FIG. 1 and FIG. 2. FIG. 1 and FIG. 2 are schematic views of different viewing angles of the cooling liquid flow control device 100 according to an embodiment of the present disclosure. In this embodiment, the cooling liquid flow control device 100 includes a heat dissipation bottom plate 110, a fixing holder 120, a cooling module 130, and a temperature control element 140. The heat dissipation bottom plate 110 has a top surface 110a and a bottom surface 110b. The bottom surface 110b is configured to be in contact with a heating element (not shown; for example, a CPU) on a substrate (not shown; for example, a PCB). The fixing holder 120 is connected to the heat dissipation bottom plate 110 and configured to be fixed to the substrate. Specifically, as shown in FIG. 1 and FIG. 2, the heat dissipation bottom plate 110 is connected to the fixing holder 120 by the fixing element S1, the heating element is in contact with the bottom surface 110b of the heat dissipation bottom plate 110, and the heating element is located between the heat dissipation bottom plate 110 and the substrate. When the fixing holder 120 is fixed toward the substrate by the fixing element S2, the heat dissipation bottom plate 110 is pressed against the heating element. The cooling module 130 is connected to the top surface 110a of the heat dissipation bottom plate 110 to form a cavity. The cooling module 130 also includes a liquid inlet pipe IT and a liquid outlet pipe OT. The cavity is configured to circulate a cooling liquid. The temperature control element 140 is connected to the cooling module 130 and is configured to adjust the flow rate of the cooling liquid in and out of the cavity.

In some embodiments, as shown in FIG. 1 and FIG. 2, the cooling liquid flow control device 100 further includes a housing H. The housing H is configured to provide protection for the temperature control element 140.

In some embodiments, the cooling liquid flow control device 100 further includes a processing unit (not shown). The processing unit is configured to receive the temperature signal from the heating element. The processing unit is also configured to convert the signal into a current and output it to the temperature control element 140.

In some embodiments, as shown in FIG. 1 and FIG. 2, the cooling liquid flow control device 100 further includes a wire W. The wire W is configured to deliver the current from the processing unit to the temperature control element 140.

Figure 3:
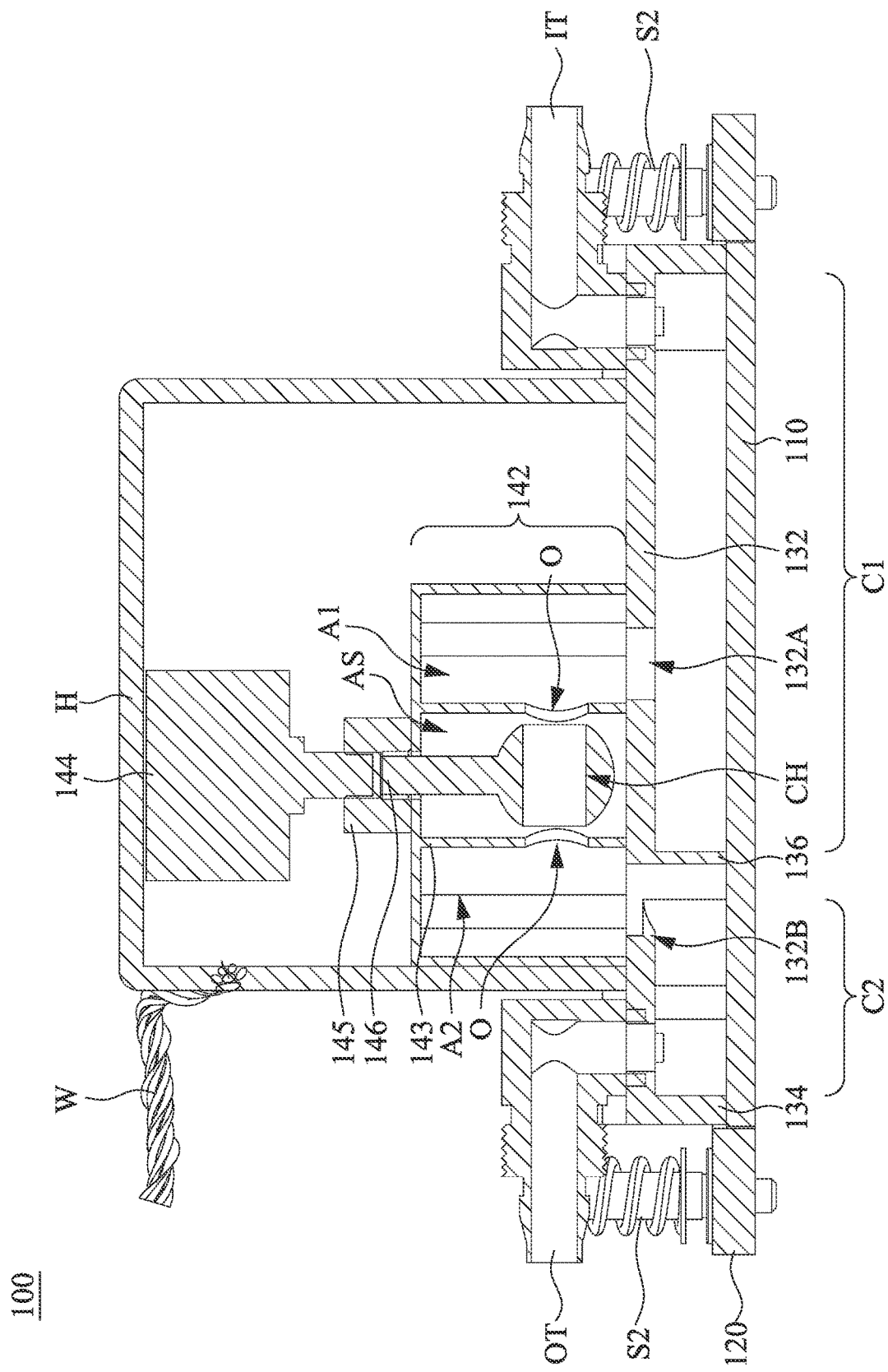
FIG. 3 shows a cross-sectional view of a cooling liquid flow control device, in accordance with an embodiment of present disclosure.
Figure 4B:
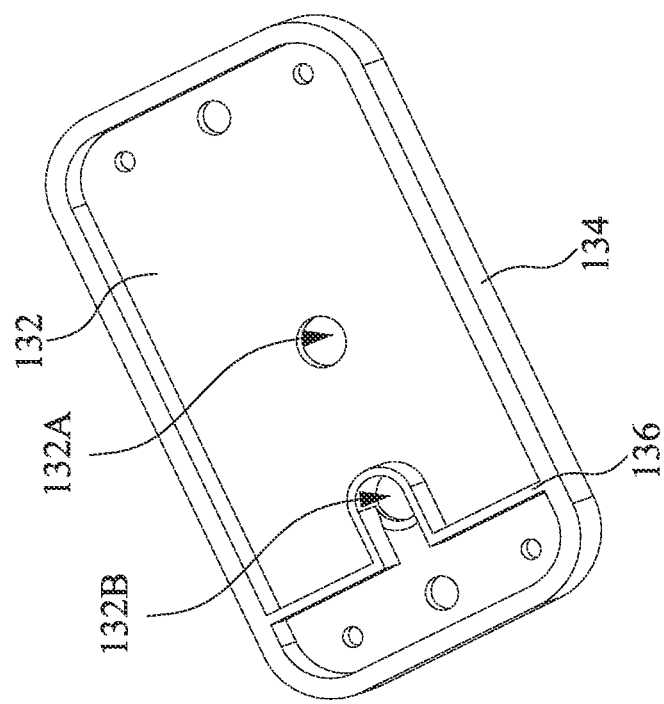
FIG. 4B shows another partial schematic view of a cooling module of a cooling liquid flow control device, in accordance with an embodiment of present disclosure.
Figure 4A:
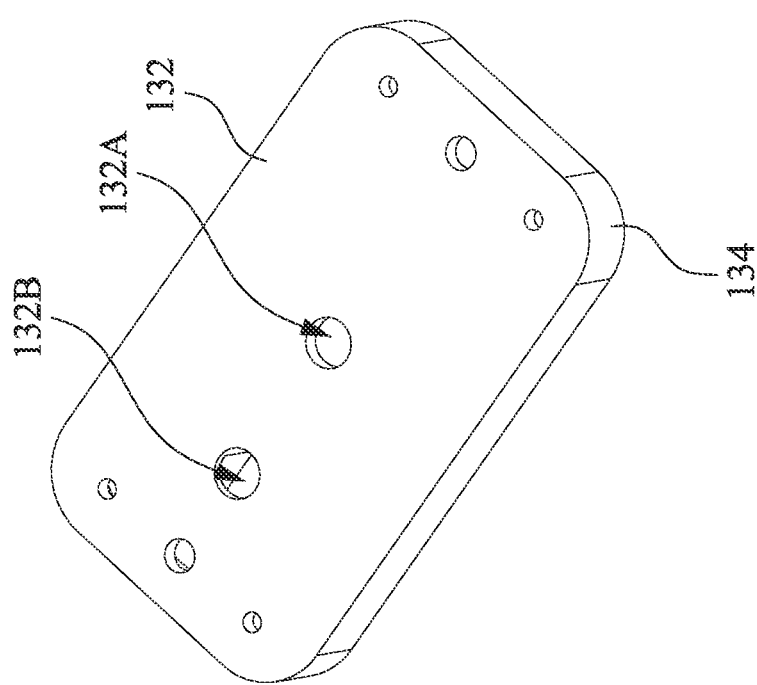
FIG. 4A shows a partial schematic view of a cooling module of a cooling liquid flow control device, in accordance with an embodiment of present disclosure.

Please refer to FIG. 3, FIG. 4A, and FIG. 4B. In this embodiment, the cooling module 130 includes a top plate 132, a side wall 134, and a separating wall 136. The top plate 132 has a liquid inlet hole 132A and a liquid outlet hole 132B. The side wall 134 extends vertically from an edge of the top plate 132 and surrounds the edge of the top plate 132, in which the side wall 134 is connected to the heat dissipation bottom plate 110. The separating wall 136 extends vertically from the top plate 132 and is configured to divide the cavity into a first sub-cavity C1 and a second sub-cavity C2. That is, the separating wall 136 separates the first sub-cavity C1 and the second sub-cavity C2, in which the separating wall 136 is connected to the heat dissipation bottom plate 110. The first sub-cavity C1 is configured to receive the cooling liquid from the liquid inlet pipe IT. The second sub-cavity C2 is configured to deliver the cooling liquid from the first sub-cavity C1 to the liquid outlet pipe OT. In some embodiments, as shown in FIG. 3, the liquid inlet hole 132A is connected between the first sub-cavity C1 and the temperature control element 140, and the liquid outlet hole 132B is connected between the temperature control element 140 and the second sub-cavity C2.

Please refer to FIG. 3 and FIG. 5. In this embodiment, the temperature control element 140 includes a chamber body 142, an actuator 144, and a valve 146. The chamber body 142 is configured to accommodate the cooling liquid from the first sub-cavity C1. The actuator 144 is close to the chamber body 142. The valve 146 is connected to the actuator 144. Specifically, the actuator 144 is connected to the valve 146 by a fixing portion 145. For example, the fixing portion 145 locks the actuator 144 and the valve 146. The valve 146 is configured to rotate based on the temperature of the heating element so as to adjust the flow rate of the cooling liquid in and out of the cavity.

Reference is made to FIG. 3 and FIG. 5. In this embodiment, the chamber body 142 further includes a liquid inlet area A1, a liquid outlet area A2, and a spacing portion 143. The liquid inlet area A1 is configured to receive the cooling liquid from the first sub-cavity C1. The liquid outlet area A2 is configured to deliver the cooling liquid from the liquid inlet area A1 to the second sub-cavity C2. The spacing portion 143 separates the liquid inlet area A1 from the liquid outlet area A2 and has an opening O. The opening O enables the cooling liquid to circulate between the liquid inlet area A1 and the liquid outlet area A2. In some embodiments, as shown in FIG. 3 and FIG. 5, the spacing portion 143 has two openings O, and the spacing portion 143 has an accommodating space AS. The accommodating space AS is configured to accommodate the valve 146. One of the openings O is connected between the liquid inlet area A1 and the accommodating space AS, and the other opening O is connected between the liquid outlet area A2 and the accommodating space AS. In this embodiment, the valve 146 has a through hole CH, and the through hole CH is disposed to be aligned with the two openings O simultaneously, so that the cooling liquid can circulate between the liquid inlet area A1 and the liquid outlet area A2 through the through hole CH.

With the aforementioned structural configurations, when the cooling liquid flows into the first sub-cavity C1 from the liquid inlet pipe IT, the cooling liquid enters the liquid inlet area A1 through the liquid inlet hole 132A. Then, the cooling liquid flows into the liquid outlet area A2 through the opening O on the spacing portion 143. Then, the cooling liquid enters the second sub-cavity C2 through the liquid outlet hole 132B, and then flows into the liquid outlet pipe OT.

Next, the way the cooling liquid flow control device 100 controls the flow rate of the cooling liquid will be discussed below.

Figure 6:
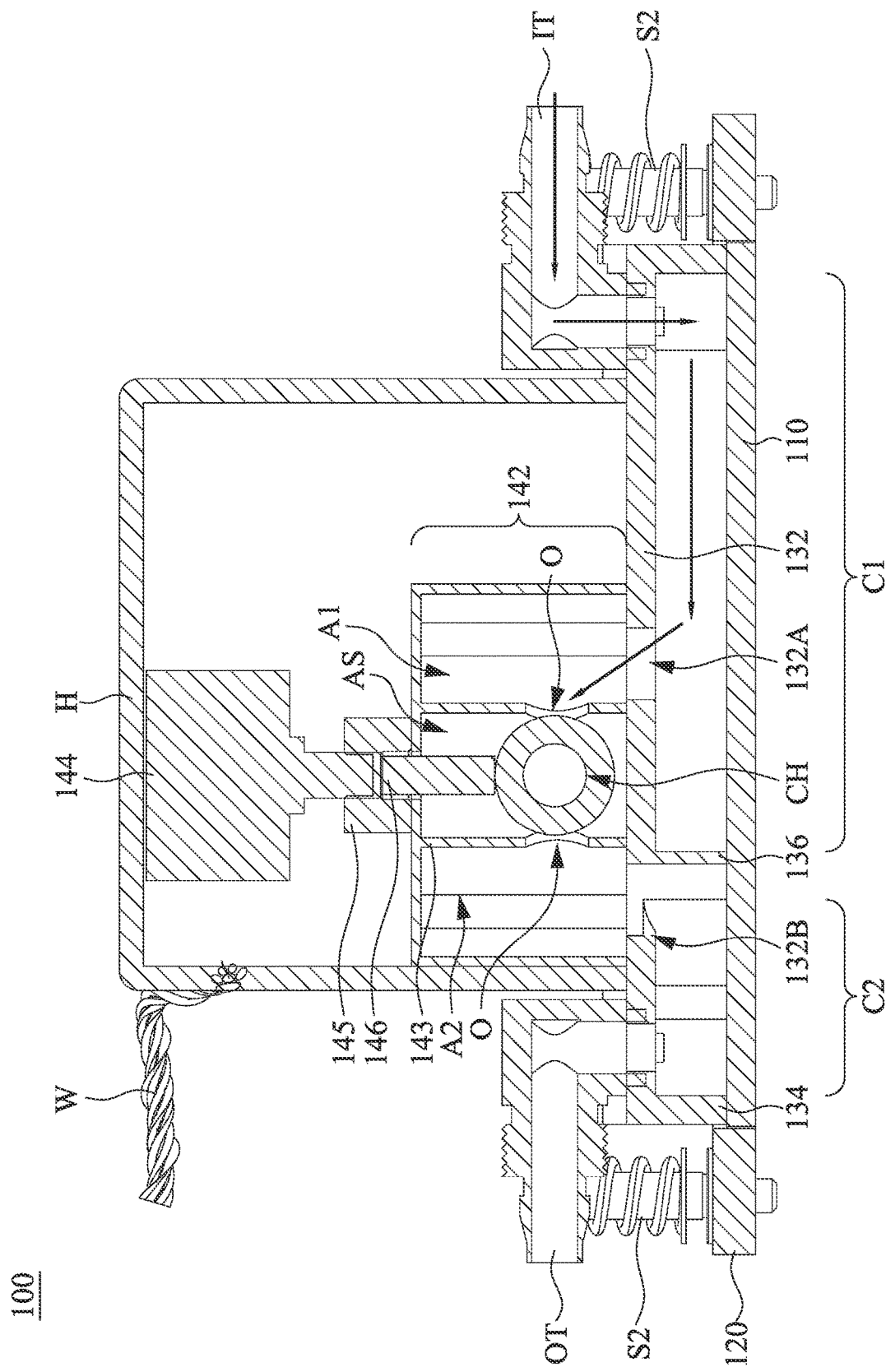
FIG. 6 shows a schematic view of a valve rotating not to communicate a liquid inlet area and a liquid outlet area, in accordance with an embodiment of present disclosure.
Figure 7:
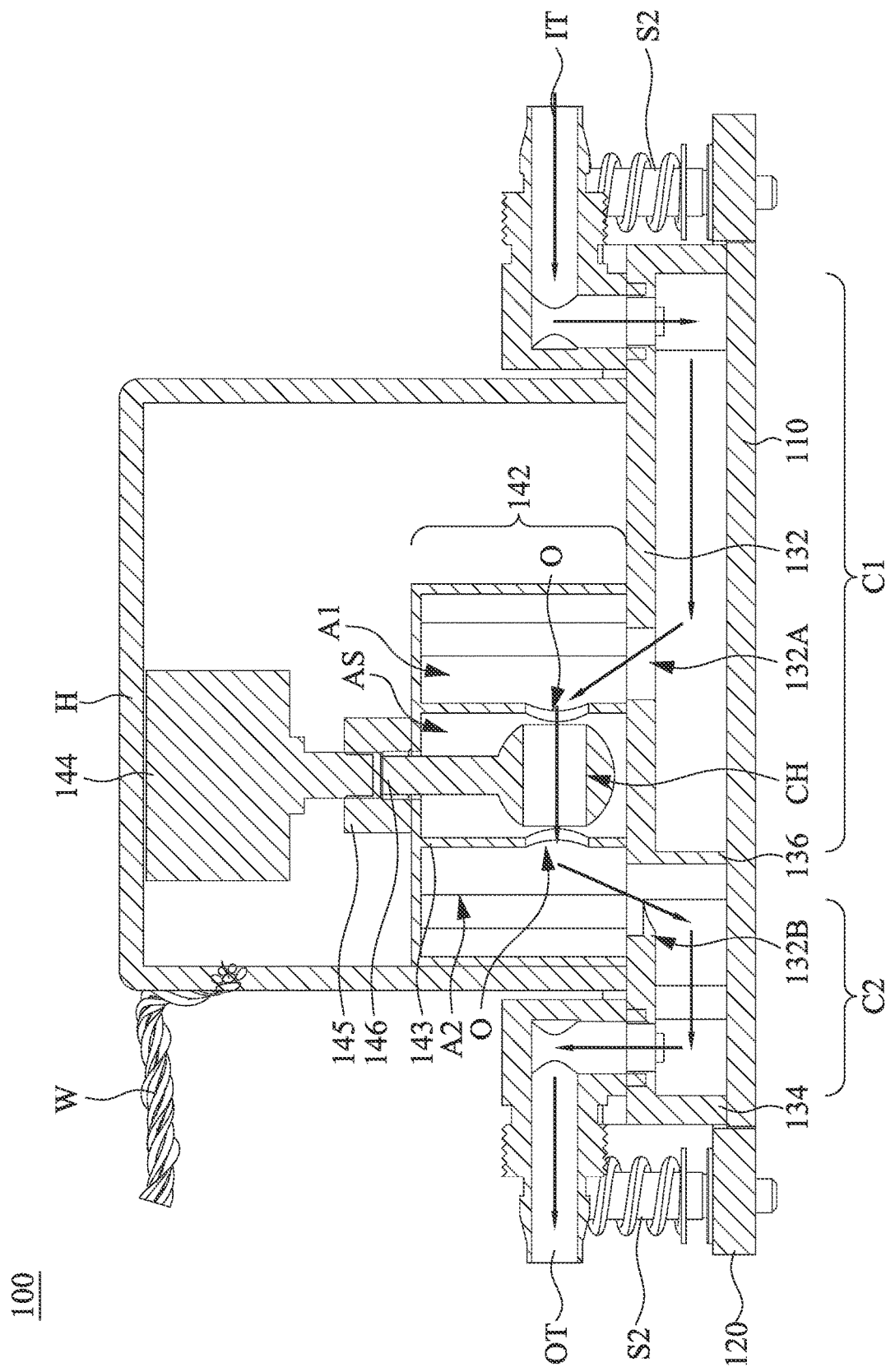
FIG. 7 shows a schematic view of the valve rotating to communicate the liquid inlet area and the liquid outlet area, in accordance with an embodiment of present disclosure.

Please refer to FIG. 6 and FIG. 7. FIG. 6 and FIG. 7 shows how the valve 146 of the temperature control element 140 rotate to control the flow rate of the cooling liquid in the cooling liquid flow control device 100. In this embodiment, for example, the temperature of the heating element is obtained by the management chip (for example, Board Management Controller (BMC)) on the substrate, in which the management chip receives the signal. The processing unit acquires the temperature of the heating element by signal conversion through the management chip on the substrate. The processing unit converts the signal into a pulse width modulation (PWM) signal output through an internal software function, and linearly converts the PWM signal with a duty ratio of 0% to 100% into the current output. The wire W receives the current input to control the rotation of the actuator 144, thereby controlling the rotation of the valve 146, and controlling a flow velocity and the flow rate of the cooling liquid according to the openness of the valve 146.

In a usage scenario, when the heating element located under the heat dissipation bottom plate 110 and in contact with the bottom surface 110b does not generate waste heat due to being in an idle state, the processing unit does not output a current to the actuator 144. When the actuator 144 does not drive the valve 146 to rotate (as shown in FIG. 6), the through hole CH is not aligned with the opening O so as not to communicate the liquid inlet area A1 and the liquid outlet area A2. Since the through hole CH is not aligned with the opening O (that is, the solid spherical surface surrounding the through hole CH partially clogs the opening O), the cooling liquid from the liquid inlet pipe IT cannot enter the liquid outlet area A2 through the opening O and the through hole CH temporarily.

In a usage scenario, when the heating element located under the heat dissipation bottom plate 110 is in a full load state and generates a relatively large amount of waste heat, the processing unit outputs a corresponding maximum current to the actuator 144 to drive the valve 146 to rotate (as shown in FIG. 7) so that the through hole CH is aligned with the opening O to communicate the liquid inlet area A1 and the liquid outlet area A2. In this case, the through hole CH and the opening O jointly form a channel, as shown in FIG. 7. Since the through hole CH is aligned with the opening O to form the channel, the cooling liquid from the liquid inlet pipe IT can enter the liquid outlet area A2 through the opening O and the through hole CH.

In the cooling liquid flow control device 100 of the present disclosure, when the heating element is in a normal operating state, the processing unit will output an appropriate current to the actuator 144, and the actuator 144 will allow the through hole CH of the valve 146 and a part of the opening O to be connected to communicate the liquid inlet area A1 and the liquid outlet area A2. In a usage scenario, when the heating element under the heat dissipation bottom plate 110 is in a partial load state and does not generate that much waste heat in a full load state, the temperature of the heating element is lower than the temperature in the full load state, and then the through hole CH communicates with merely a part of the cross section of the opening O. Since the through hole CH only communicates with the part of the cross section of the opening O, the cooling liquid from the inlet pipe IT can enter the liquid outlet area A2 and the second sub-chamber C2 through the opening O and the through hole CH at a relatively low flow rate.

Through the above operations, the cooling liquid flow control device 100 can appropriately control the flow rate of the cooling liquid based on the temperature of the heating element so as to achieve the effects of controlling the flow rate of the cooling liquid and saving energy.

In some embodiments, as shown in FIG. 5, the center of the spacing portion 143 is formed as a hollow cylindrical extending portion to form the accommodating space AS, but the present disclosure is not limited thereto. In some other embodiments, the center of the spacing portion 143 may not be formed as a hollow cylindrical extending portion without the accommodating space AS. In the embodiment in which the spacing portion 143 does not have the accommodating space AS, the spacing portion 143 has merely one opening O, and this opening O is connected between the valve 146 and one of the liquid inlet area A1 and the liquid outlet area A2 (that is, the valve 146 may be located in the liquid inlet area A1 or the liquid outlet area A2). Specifically, a spherical portion located at the lower part of the valve 146 abuts against the aforementioned opening O.

In the embodiment in which the spacing portion 143 does not have the accommodating space AS, when the through hole CH is aligned with the opening O, the through hole CH and the opening O jointly constitute the aforementioned channel. In this case, the actuator 144 can still rotate corresponding to the current to control the flow rate of the cooling liquid in the cooling liquid flow control device 100.

In some embodiments, as shown in FIG. 1, FIG. 2, FIG. 6, and FIG. 7, the fixing element S2 includes elements such as springs and screws, but the present disclosure is not limited thereto. In some embodiments, the fixing element S2 may not include a spring. Although the present disclosure discloses that the fixing holder 120 is connected to the substrate by means of locking, the present disclosure does not intend to limit the structure, method, or means for connecting the fixing holder 120 to the substrate.

In some embodiments, as shown in FIG. 1, FIG. 2, FIG. 5, and FIG. 7, the fixing element S1 is substantially a screw. Although the present disclosure discloses that the heat dissipation bottom plate 110 and the fixing holder 120 are connected to each other by means of locking (for example, the heat dissipation bottom plate 110 and the fixing holder 120 are locked to each other through the fixing element S1), the present disclosure does not intend to limit the structure, method, or means for connecting the heat dissipation bottom plate 110 and the fixing holder 120 to each other.

In some embodiments, the composition of the cooling liquid may be liquid water ($H_2O$), but the present disclosure is not limited thereto. In some embodiments, the composition of the cooling liquid may be ethylene glycol ($C_2H_6O_2$) or propylene glycol ($C_3H_8O_2$). The above is merely an example for simple description, and the present disclosure does not intend to limit the composition of the cooling liquid.

In some embodiments, the heat dissipation bottom plate 110 and the cooling module 130 are substantially separated from each other, but the present disclosure is not limited thereto. In some embodiments, the heat dissipation bottom plate 110 and the cooling module 130 may be integrally formed rather than separately provided. For example, the heat dissipation bottom plate 110 and the cooling module 130 can be integrally formed into a water cooling case body with a cavity C.

In some embodiments, the heat dissipation bottom plate 110 and the cooling module 130 are substantially tightly connected. Alternatively, in some embodiments, the heat dissipation bottom plate 110 and the cooling module 130 may be adhesively connected to each other. Alternatively, in some embodiments, the heat dissipation bottom plate 110 and the cooling module 130 may be buckled and connected to each other. The foregoing is merely an example for simple description, and the present disclosure does not intend to limit the structure, method, or means for connecting the heat dissipation bottom plate 110 and the cooling module 130 to each other.

In some embodiments, for example, the actuator 144 may be a stepper motor or an induction motor. The above is merely an example for simple description, and the present disclosure does not intend to limit the structure or material of the actuator 144. Specifically, any structure, method, or means capable of allowing the actuator 144 to rotate correspondingly based on the current and drive the valve 146 to rotate are within the spirit and scope of the present disclosure.

In some embodiments, the temperature control element 140 is disposed on the cooling module 130, but the present disclosure is not limited thereto. In some embodiments, for example, the temperature control element 140 may be disposed between the first sub-cavity C1 and the second sub-cavity C2. The present disclosure does not intend to limit the location of the temperature control element 140.

From the above detailed description of the specific embodiments of the present disclosure, since the temperature control element utilizes the feature that the valve can rotate based on the temperature of the heating element, the through holes of the valve can be aligned or not aligned with the openings to achieve the purpose of controlling the flow rate of the cooling liquid. In the cooling liquid flow control device of the present disclosure, the valve can proportionally communicate the liquid inlet area and the liquid outlet area based on the temperature of the heating element, thereby achieving the energy saving effect of the cooling liquid flow control device.

In an embodiment of the present disclosure, the cooling system of the present disclosure can be applied to a server, which can be used for artificial intelligence (AI) computing, edge computing, or used as a 5G server, cloud server or vehicle networking server.

Although the present disclosure has been disclosed as above in the embodiment manner, it is not intended to limit the present disclosure. Those skilled in the art can make various changes and modifications without departing from the spirit and scope of the present disclosure. Therefore, the scope of the present disclosure shall be subject to the scope of the attached claims.

What is claimed is:

1. A cooling liquid flow control device, comprising:
   a heat dissipation bottom plate having a bottom surface configured to be in contact with a chipset serving as a heating element on a substrate;
   a fixing holder connected to the heat dissipation bottom plate and configured to be fixed with the substrate;
   a cooling module connected to a top surface of the heat dissipation bottom plate to form a cavity, the cavity being configured to circulate a cooling liquid, the cavity further comprising a first sub-cavity and a second sub-cavity; and
   a temperature control element connected to the cooling module and comprising:
      a chamber body configured to accommodate the cooling liquid from the first sub-cavity;
      an actuator close to the chamber body; and
      a valve connected to the actuator configured to actuate the valve, wherein the valve is configured to rotate based on a temperature of the heating element, thereby adjusting a flow rate of the cooling liquid in and out of the cavity.

2. The cooling liquid flow control device of claim 1, wherein the cooling module comprises a liquid inlet pipe and a liquid outlet pipe,
   the first sub-cavity is configured to receive the cooling liquid from the liquid inlet pipe, and
   the second sub-cavity is configured to deliver the cooling liquid from the first sub-cavity to the liquid outlet pipe.

3. The cooling liquid flow control device of claim 2, wherein the cooling module further comprises:
   a top plate having a liquid inlet hole and a liquid outlet hole, wherein the liquid inlet hole is connected between the first sub-cavity and the temperature control element, and the liquid outlet hole is connected between the temperature control element and the second sub-cavity;
   a side wall extending vertically from an edge of the top plate and surrounding the edge of the top plate, wherein the side wall is connected to the heat dissipation bottom plate; and
   a separating wall extending vertically from the top plate and separating the first sub-cavity and the second sub-cavity, wherein the separating wall is connected to the heat dissipation bottom plate.

4. The cooling liquid flow control device of claim 1, further comprising a processor, wherein the processor is configured to:
   receive a signal of the temperature of the heating element; and
   convert the signal to a current output to the actuator, wherein the current causes the valve to rotate.

5. The cooling liquid flow control device of claim 1, wherein the chamber body comprises:
   a liquid inlet area configured to receive the cooling liquid from the first sub-cavity;
   a liquid outlet area configured to deliver the cooling liquid from the liquid inlet area to the second sub-cavity; and
   a spacing portion configured to separate the liquid inlet area and the liquid outlet area.

6. The cooling liquid flow control device of claim 5, wherein the spacing portion has an opening connected between the valve and one of the liquid inlet area and the liquid outlet area.

7. The cooling liquid flow control device of claim 6, wherein the valve has a through hole, and when the through hole is aligned with the opening, the through hole and the opening jointly form at least a part of a channel.

8. The cooling liquid flow control device of claim 7, wherein the spacing portion further has another opening and an accommodating space for accommodating the valve, the opening is connected between the liquid inlet area and the accommodating space, and the another opening is connected between the liquid outlet area and the accommodating space, wherein when two ends of the through hole are aligned with the opening and the another opening respectively, the through hole, the opening, and the another opening jointly form the channel.

9. The cooling liquid flow control device of claim 8, wherein the valve is configured to:
   rotate to cause the through hole not to be aligned with the opening so as not to communicate the liquid inlet area and the liquid outlet area when the heating element is in an idle state; and
   rotate to cause the through hole to be aligned with the opening so as to communicate the liquid inlet area and the liquid outlet area when the heating element is in a normal operating state.

\* \* \* \* \*